United States Patent
Liu

(10) Patent No.: US 11,313,025 B2
(45) Date of Patent: Apr. 26, 2022

(54) MASK SHEET AND PIXEL STRUCTURE

(71) Applicant: WUHAN CHINA STAR OPTOELECTRONICS SEMICONDUCTOR DISPLAY TECHNOLOGY CO., LTD., Hubei (CN)

(72) Inventor: Zhiqiao Liu, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 315 days.

(21) Appl. No.: 16/640,762

(22) PCT Filed: Nov. 4, 2019

(86) PCT No.: PCT/CN2019/115300
§ 371 (c)(1),
(2) Date: Feb. 21, 2020

(87) PCT Pub. No.: WO2021/027090
PCT Pub. Date: Feb. 18, 2021

(65) Prior Publication Data
US 2021/0404048 A1    Dec. 30, 2021

(30) Foreign Application Priority Data

Aug. 9, 2019 (CN) .......................... 201910734140.4

(51) Int. Cl.
*C23C 14/04* (2006.01)
*B05C 21/00* (2006.01)
(Continued)

(52) U.S. Cl.
CPC ............ *C23C 14/042* (2013.01); *B05C 17/06* (2013.01); *B05C 21/005* (2013.01); *C23C 14/12* (2013.01);
(Continued)

(58) Field of Classification Search
USPC .................... 118/720, 721, 504, 505; 257/40
See application file for complete search history.

(56) References Cited

U.S. PATENT DOCUMENTS 8,754,913 B2    6/2014  Minkyu et al.
2014/0319484 A1*  10/2014  Kwon ................. H01L 51/5209
                                                                 257/40
(Continued)

FOREIGN PATENT DOCUMENTS

CN    107742637 A    2/2018
CN    108594544 A    9/2018
(Continued)

OTHER PUBLICATIONS

English Translation CN-208722880 (Year: 2019).*

*Primary Examiner* — Yewebdar T Tadesse

(57) ABSTRACT

The disclosure provides a mask sheet and a pixel structure. The mask sheet includes a mask opening configured to manufacture a sub-pixel in a pixel opening of a display panel. An area of the mask opening is greater than an area of the pixel opening corresponding thereto. The pixel opening includes at least one curved edge with an inner concave surface, the mask opening includes at least one mask edge, and the at least one mask sheet is in one-to-one correspondence with the at least one curved edge. A curvature of each mask edge is less than a curvature of the curved edge corresponding thereto.

20 Claims, 6 Drawing Sheets

(51) Int. Cl.
  *C23C 14/12* (2006.01)
  *C23C 14/24* (2006.01)
  *H01L 51/00* (2006.01)
  *H01L 51/56* (2006.01)
  *B05C 17/06* (2006.01)

(52) U.S. Cl.
  CPC .......... *C23C 14/24* (2013.01); *H01L 51/0011* (2013.01); *H01L 51/56* (2013.01)

(56) References Cited

U.S. PATENT DOCUMENTS

2019/0144987 A1* 5/2019 Guo ................. H01L 51/56
  118/504
2020/0075691 A1 3/2020 Zhou et al.

FOREIGN PATENT DOCUMENTS

| | | |
|---|---|---|
| CN | 109427851 A | 3/2019 |
| CN | 208722880 U | 4/2019 |
| CN | 109768073 A | 5/2019 |
| CN | 109935617 A | 6/2019 |
| CN | 208970513 U | 6/2019 |
| WO | 2019009526 A1 | 1/2019 |

* cited by examiner

MASK SHEET AND PIXEL STRUCTURE

FIELD

The present disclosure relates to the field of display panel technology, and more particularly, relates to a mask sheet and a pixel structure.

BACKGROUND

Background information mentioned below is not necessary to be regarded as prior art.

Currently, an organic light-emitting layer of organic light-emitting diode (OLED) display panels is manufactured by vacuum deposition. During processes of manufacturing a device, organic materials are evaporated on a substrate which is positioned above an evaporation source, by high temperature evaporation. To evaporate the organic materials to a predetermined position according to designs, a fine metal mask (FMM) is indispensable. A plurality of openings, which are designed in advance, are defined on the FMM, and the organic materials are deposited on a backplate through the openings to form a plurality of pixels with predetermined shapes.

With increasing demands for resolutions and brightness of OLED display panels, designs of pixel structures having a high aperture ratio and high pixel density have become increasingly complicated. Shapes of pixels are diverse; however, non-uniform designs of pixels result in difficulties in manufacturing corresponding FMMs. Furthermore, wrinkles are easily generated during a mask tension process of FMMs, causing an alignment error between organic materials which are evaporated and predetermined positions of pixels on the backplate, and colors of the pixels are easily mixed with each other, thereby affecting performance of products. In summary, designs of pixel structures limit aperture designs of FMMs and affect mass production of FMMs.

SUMMARY

The present disclosure provides a mask sheet and a pixel structure. By designing curvatures of mask edges, to which curved edges with an inner concave surface of a mask opening and a pixel opening correspond, to be less than curvatures of the curved edges, a size of the mask opening of the mask sheet may be non-proportionally enlarged relative to a size of the pixel opening of the mask sheet corresponding thereto, which solves problems that mask sheets are difficult to be manufactured and wrinkles are easily generated on the mask sheets.

To solve the above problems, technical solutions provided by the present disclosure are described below:

The present disclosure provides a mask sheet, including a mask opening configured to manufacture a sub-pixel in a pixel opening of a display panel. An area of the mask opening is greater than an area of the pixel opening to which the mask opening corresponds, the pixel opening includes at least one curved edge with an inner concave surface, and the mask opening includes at least one mask edge. The at least one mask edge is in one-to-one correspondence with the at least one curved edge, and a curvature of each of the at least one mask edge is less than a curvature of the at least one curved edge to which the each of the at least one mask edge corresponds.

In the mask sheet provided by an embodiment of the present disclosure, the at least one mask edge is a straight line.

In the mask sheet provided by an embodiment of the present disclosure, the at least one mask edge is a curved line.

In the mask sheet provided by an embodiment of the present disclosure, the at least one mask edge is an arc, and a central angle of the arc is greater than 0° and less than or equal to 30°.

In the mask sheet provided by an embodiment of the present disclosure, a shape of the mask opening is axisymmetric.

In the mask sheet provided by an embodiment of the present disclosure, a shape of the mask opening includes a regular polygon or a regular polygon with a chamfer.

In the mask sheet provided by an embodiment of the present disclosure, a shape of the pixel opening is an axisymmetric octagon, the pixel opening includes four curved edges, and adjacent two curved edges are connected to each other by a first straight edge and correspond to the other adjacent two curved edges.

A shape of the mask opening is an axisymmetric octagon, the mask opening includes four mask edges which are in one-to-one correspondence with four curved edges, and adjacent two mask edges are connected to each other by a second straight edge.

In the mask sheet provided by an embodiment of the present disclosure, lengths and curvatures of the four curved edges are the same, and lengths and curvatures of the four mask edges are the same.

In the mask sheet provided by an embodiment of the present disclosure, the first straight edge is parallel to the second straight edge, and a length of the first straight edge is less than a length of the second straight edge.

In the mask sheet provided by an embodiment of the present disclosure, a distance between the second straight edge and the first straight edge to which the second straight edge corresponds is greater than a distance between one of the four mask edges and one of the four curved edges to which the one of the four mask edges corresponds.

In the mask sheet provided by an embodiment of the present disclosure, the mask sheet includes a fine metal mask sheet.

The present disclosure further provides a mask sheet, including a mask opening configured to manufacture a sub-pixel in a pixel opening of a display panel, wherein an area of the mask opening is larger than an area of a pixel opening to which the mask opening corresponds.

A shape of the mask opening is an axisymmetric octagon, the mask opening includes four mask edges which are in one-to-one correspondence with four curved edges having four inner concave surfaces, and adjacent two mask edges are connected to each other by a second straight edge. The first straight edge is parallel to the second straight edge, and a length of the first straight edge is less than a length of the second straight edge.

The present disclosure provides a pixel structure, including a sub-pixel formed in a pixel opening of a display panel, wherein the sub-pixel is made by a mask sheet.

The mask sheet includes a mask opening configured to manufacture a sub-pixel in a pixel opening of a display panel, an area of the mask opening is greater than an area of the pixel opening to which the mask opening corresponds, the pixel opening includes at least one curved edge with an inner concave surface, and the mask opening includes at least one mask edge. The at least one mask edge is in one-to-one correspondence with the at least one curved edge, and a curvature of each of the at least one mask edge is less than a curvature of the at least one curved edge to which the each of the at least one mask edge corresponds.

In the pixel structure provided by an embodiment of the present disclosure, the at least one mask edge is a straight line.

In the pixel structure provided by an embodiment of the present disclosure, the at least one mask edge is a curved line.

In the pixel structure provided by an embodiment of the present disclosure, the at least one mask edge is an arc, and a central angle of the arc is greater than 0° and less than or equal to 30°.

In the pixel structure provided by an embodiment of the present disclosure, a shape of the mask opening is axisymmetric.

In the pixel structure provided by an embodiment of the present disclosure, a shape of the mask opening includes a regular polygon or a regular polygon with a chamfer.

In the pixel structure provided by an embodiment of the present disclosure, a shape of the pixel opening is an axisymmetric octagon, the pixel opening includes four curved edges, and adjacent two curved edges are connected to each other by a first straight edge and correspond to the other adjacent two curved edges.

A shape of the mask opening is an axisymmetric octagon, the mask opening includes four mask edges which are in one-to-one correspondence with four curved edges, and adjacent two mask edges are connected to each other by a second straight edge.

In the pixel structure provided by an embodiment of the present disclosure, lengths and curvatures of the four curved edges are the same, and lengths and curvatures of the four mask edges are the same.

Regarding the beneficial effects: as to designs of pixel opening including at least one curved edge having an inner concave surface, compared to a technical solution that size of a mask opening of a mask sheet is proportionally enlarged relative to a size of the pixel opening of the mask sheet corresponding thereto, in the present disclosure, an area of the mask opening is greater than an area of the pixel opening, and curvatures of mask edges, to which the curved edges with an inner concave surface of the mask opening and the pixel opening correspond, are less than curvatures of the curved edges. Therefore, a size of the mask opening of the mask sheet may be non-proportionally enlarged relative to a size of the pixel opening of the mask sheet corresponding thereto, and sizes of the mask openings in different positions of the mask sheet may be adjusted within the range of operation allowance. Furthermore, the mask edge of the mask opening is prevented from being manufactured to be a curved edge with an inner concave surface, which simplifies a manufacturing process of the mask opening of the mask sheet and realizes mass production of the mask sheet having a pixel structure with the curved edge which is mentioned above. A straight-line-shaped mask edge, to which the curved edge of the pixel opening corresponds, can not only further simplify the manufacturing process of the mask opening, but also significantly reduce a possibility that wrinkles occur on the mask sheet during a mask tension process, thereby reducing a possibility of color mixture between adjacent sub-pixels of a display panel.

DESCRIPTION OF DRAWINGS

The accompanying figures to be used in the description of embodiments of the present disclosure or prior art will be described in brief to more clearly illustrate the technical solutions of the embodiments or the prior art. The accompanying figures described below are only part of the embodiments of the present disclosure, from which those skilled in the art can derive further figures without making any inventive efforts.

DETAILED DESCRIPTION

Figure 1:
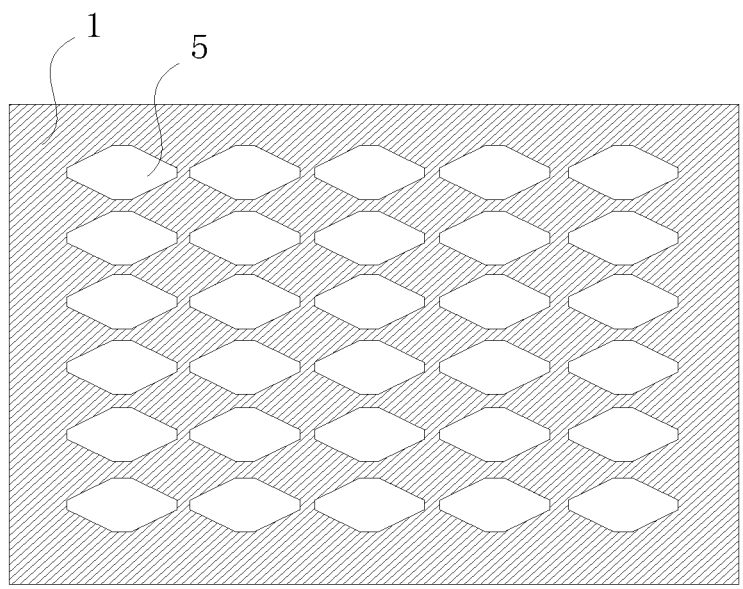
FIG. 1 is a schematic structural view showing a mask sheet provided by an embodiment of the present disclosure.

The specific structures and detail functions disclosed herein are merely representative and are for purposes of describing exemplary embodiments of the present invention. However, the present invention may be embodied in many alternate forms and should not be construed as being limited to the embodiments set forth herein.

In the description of the present disclosure, it should be understood that terms such as "center", "longitudinal", "lateral", "length", "width", "thickness", "upper", "lower", "front", "rear", "left", "right", "vertical", "horizontal", "top", "bottom", "inside", "outside", as well as derivative thereof should be construed to refer to the orientation as then described or as shown in the drawings under discussion. These relative terms are for convenience of description, do not require that the present disclosure be constructed or operated in a particular orientation, and shall not be construed as causing limitations to the present disclosure. In addition, terms such as "first" and "second" are used herein for purposes of description and are not intended to indicate or imply relative importance or significance. Thus, features limited by "first" and "second" are intended to indicate or imply including one or more than one of these features. In the description of the present disclosure, "a plurality of" relates to two or more than two, unless otherwise specified.

Terms used herein are for the purpose of describing the particular embodiments. Unless specified or limited otherwise, the singular forms like "a" used herein are also intended to include the plural. It should be noted that, terms such as "include" and/or "include" used herein are intended to mean the existence of the recited features, integers, steps, operations, units and/or components, and does not exclude the presence or addition of one or more other features, integers, steps, operations, units, components, and/or combinations thereof.

The present disclosure will be further described below in conjunction with the accompanying drawings and embodiments.

As shown in FIG. 1 to FIG. 8, an embodiment of the present disclosure provides a mask sheet 1, including a mask opening 5 configured to manufacture a sub-pixel 3 in a pixel opening 2 of a display panel. An area of the mask opening 5 is greater than an area of the pixel opening 2 to which the mask opening 5 corresponds, the pixel opening 2 includes at least one curved edge 6 with an inner concave surface, and the mask opening 5 includes at least one mask edge 7. The at least one mask edge 7 is in one-to-one correspondence with the at least one curved edge 6, and a curvature of each of the at least one mask edge 7 is less than a curvature of the at least one curved edge 6 to which the each of the at least one mask edge 7 corresponds.

Specifically, the mask sheet 1 of the present embodiment includes a fine metal mask (FMM) and the display panel includes an organic light-emitting diode (OLED) display panel. Generally, the sub-pixel 3 on the display panel is an organic electroluminescent structure which is a film formed by evaporating organic materials into the pixel opening 2 to which the mask opening 5 of the FMM corresponds. The mask opening 5 of the FMM is typically formed by isotropic etching characterized in that etching proceeds at equal rates in both horizontal and vertical direction to form a pot-shaped pattern. Therefore, a lateral side of the mask opening 5 is a bevel, which affects evaporation effects. To ensure that the sub-pixel 3 in the pixel opening 2 can be formed completely (ensure luminescent performance for the organic light-emitting structure), an area of the mask opening 5, to which the pixel opening 2 corresponds, is greater than an area of the pixel opening 2, and a size of the mask opening 5 is within the range of operation allowance.

Specifically, the mask sheet 1 needs to be tensioned, be attached to, and align with the display panel when the sub-pixel 3 is manufactured by the mask sheet 1. Therefore, an orthographic projection of the mask opening 5 on the mask sheet 1 fully covers an orthographic projection of the pixel opening 2 on the mask sheet 1. Meanwhile, edges of the mask opening 5 are in one-to-one correspondence with edges of the pixel opening 2, a minimum distance between each of the edges of the mask opening 5 and edges of the pixel opening 2 is greater than or equal to operation allowance, and a maximum distance between each of the edges of the mask opening 5 and edges of the pixel opening 2 is less than the minimum distance between adjacent two pixel openings 2. After the mask sheet 1 is attached to and aligns with the display panel, organic materials will be evaporated into the pixel opening 2 by the mask opening 5 to form the sub-pixel 3. It should be noted that since an area of the mask opening 5 is greater than an area of the pixel opening 2, some of the organic materials may be evaporated to a non-opening position (pixel defining layer) between the pixel opening 2 and the mask opening 5 to which the pixel opening 2 corresponds. Only some of the organic materials will be lighted after a voltage is applied to the display panel, while the organic materials that are deposited at the non-opening position will not be lighted. As a result, the organic materials that are deposited at the non-opening position do not belong to the sub-pixel 3, that is, a shape of the sub-pixel 3 and a shape of the pixel opening 2 are same, which means the shape of the pixel opening 2 determines the shape of the sub opening 3.

Specifically, the mask opening 5 of the FMM is manufactured by etching. Both two surfaces of the mask opening 5, which contains a curved edge 6 with an inner concave surface, need to be manufactured by etching, which has a difficult manufacturing process and is not easy to realize mass production. However, compared to the mask opening 5 having the curved edge 6 with an inner concave surface, the mask opening 5 having a straight edge or a nearly straight edge has an easier manufacturing process. Therefore, each edge of the mask opening 5 having a straight edge or a nearly straight edge is controllable, and a quality of the mask sheet 1 made by the mask opening 5 having a straight edge or a nearly straight is ensured.

In the present embodiment, as for designs of the pixel opening 2 including at least one curved edge 6 having an inner concave surface, compared to a technical solution that a size of the mask opening 5 of the mask sheet 1 is proportionally enlarged relative to a size of the pixel opening 2 of the mask sheet 5 corresponding thereto, in the present disclosure, an area of the mask opening 5 is greater an area of the pixel opening 2, and a curvature of the mask edge 7, to which the curved edge 6 with an inner concave surface of the mask opening 5 and the curved edges 6 correspond, is less than a curvature of the curved edge 6. Therefore, a size of the mask opening 5 of the mask sheet 1 may be non-proportionally enlarged relative to a size of the pixel opening 2 of the mask sheet 1 corresponding thereto, and the size of the mask opening 5 of the mask sheet 1 may be adjusted within the range of operation allowance. Furthermore, the mask edge 7 of the mask opening 5 is prevented from being manufactured to be the same as the curved edge 6 of the pixel opening 2 which has an inner concave surface, which simplifies a manufacturing process of the mask opening 5 of the mask sheet 1 and realizes mass production of the mask sheet 1 having the sub-pixel 3 with the curved edge 6 which is mentioned above.

Figure 3:
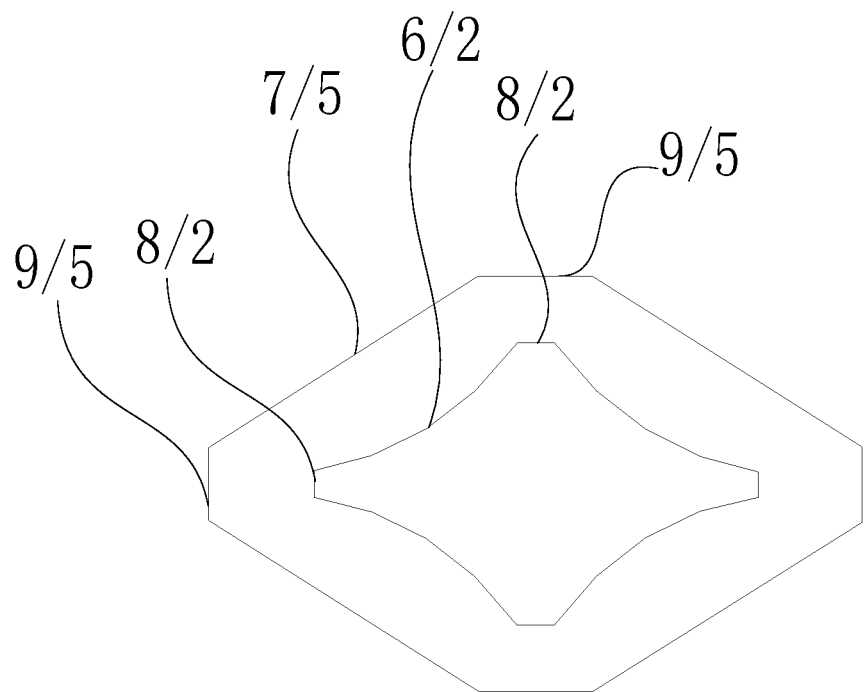
FIG. 3 is an enlarged schematic view showing a mask opening and the pixel opening in a region A in FIG. 2.
Figure 8:
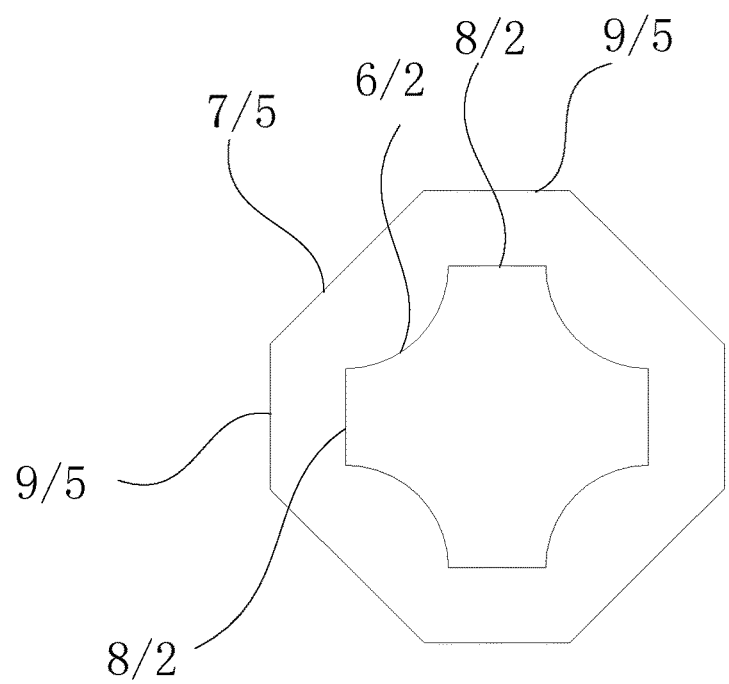
FIG. 8 is another enlarged schematic view showing a mask opening and a pixel opening in the region B in FIG. 6.

In one embodiment, as shown in FIG. 3 and FIG. 8, the mask edge 7 is a straight line. In the present embodiment, the mask edge 7, to which the curved edge 6 of the pixel opening 2 corresponds, is manufactured to be a straight line. For one thing, a manufacturing process of the mask opening 5 of the mask sheet 1 may be simplified; besides, a possibility of color mixture between adjacent sub-pixels 3 of the display panel is reduced. As a result, display effect of the display panel is ensured.

In one embodiment, a shape of the mask opening 5 is axisymmetric. Specifically, the mask opening 5 may include one or more axes of symmetry; for example, the mask opening 5 of the mask sheet 1 are symmetrical in both horizontal and vertical direction. When the mask sheet 1 is tensioned, forces applied to the mask opening 5 are distributed evenly in both horizontal and vertical direction, which prevents wrinkles from occurring on the mask sheet 1 caused by pull forces, thereby further preventing an alignment error, which results in color mixture, from occurring on a location of the sub-pixel 3 which is formed by evaporation.

In one embodiment, a shape of the mask opening 5 includes a regular polygon or a regular polygon with a chamfer (not shown). Specifically, edges of the regular polygon are straight edges or nearly straight edges, and the sub-pixel 3 may be a regular polygon or an irregular polygon. In the present embodiment, the mask sheet 1 not only can be used to manufacture the regular polygon sub-pixel 3 which has the curved edge 6 with an inner concave surface, but also can be used to manufacture the polygon sub-pixel 3 having a straight edge. Therefore, the mask sheet 1 has a wide range of applications.

Figure 2:
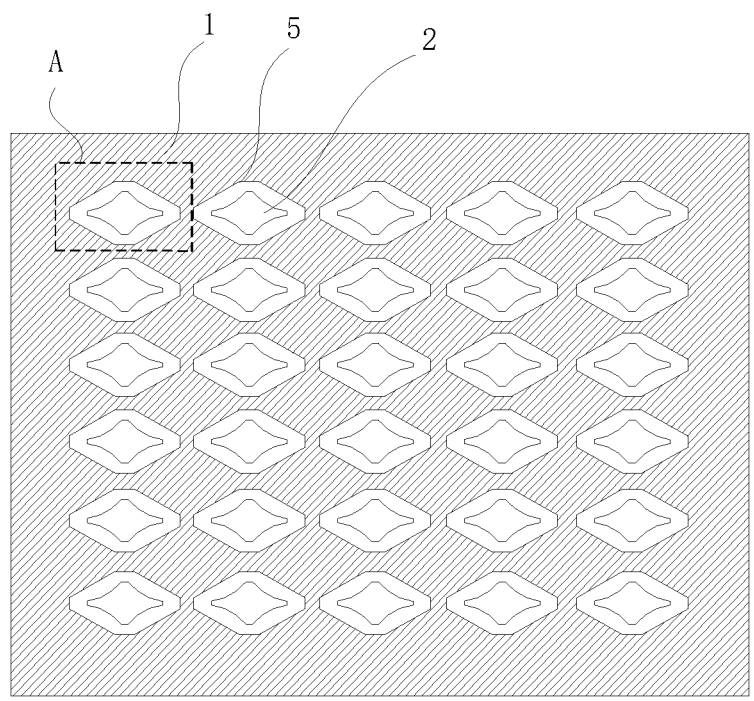
FIG. 2 is a schematic structural view showing a mask sheet and pixel openings provided by an embodiment of the present disclosure.
Figure 6:
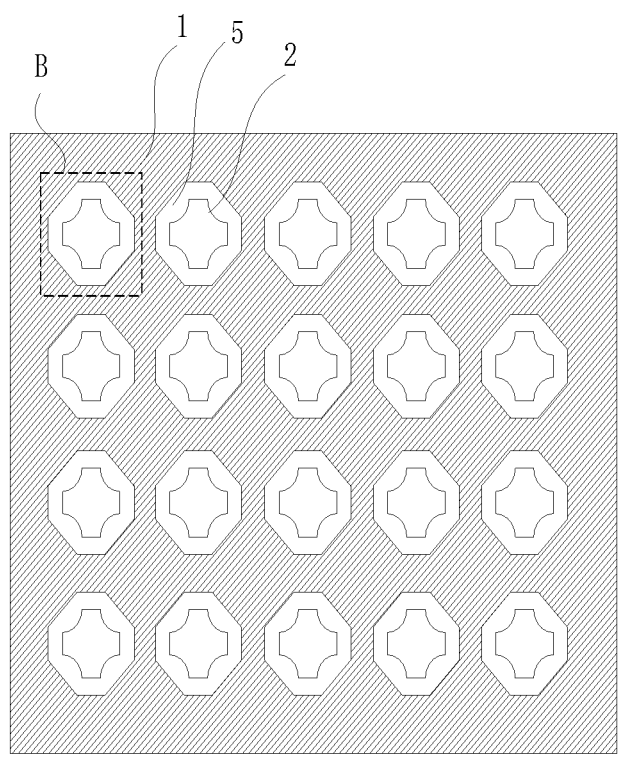
FIG. 6 is a schematic structural view showing another mask sheet and another pixel opening provided by an embodiment of the present disclosure.

In one embodiment, as shown in FIG. 1, FIG. 2, and FIG. 6, a number of the mask opening 5 on the mask sheet 1 is provided in plural, a number of the pixel opening 2 on the display panel is provided in plural, and the number of the mask opening 5 and the number of the pixel opening 2 on the display panel may be same and in one-to-one correspondence. Meanwhile, the sub-pixel 3 may be manufactured by corresponding only one mask sheet 1 to pixels of the display panel. Specifically, sizes and shapes of the pixel openings 2 are same, and the pixel openings 2 are distributed in an array; sizes and shapes of the mask openings 5 on the mask sheet 1 are same, and the mask openings 5 are arranged in an array. Of course, the number of the mask opening 5 may also be less than the number of the pixel opening 2 on the display panel, and the mask openings 5 on the mask sheet 1 and some of the pixel openings 2 are in one-to-one correspondence. Meanwhile, sizes and shapes of the pixel openings 2 on the display panel are not completely same. The pixel openings 2 having same sizes and shapes are evenly distributed on the display panel and correspond to a same mask sheet. Therefore, such sub-pixels of the display panel need to be manufactured by the cooperation of multiple mask sheets. Furthermore, shapes, sizes, and distributed locations of mask openings on different mask sheets are different. As a result, in the present embodiment, the mask sheet 1 may be used to independently manufacture all sub-pixels 3 on the display panel. Alternatively, the mask sheet 1 may be used with other mask sheets to manufacture sub-pixels in different shapes and sizes on the display panel, and arrangements of mask openings on each mask sheet are decided by arrangements of pixel openings corresponding thereto.

Figure 4:
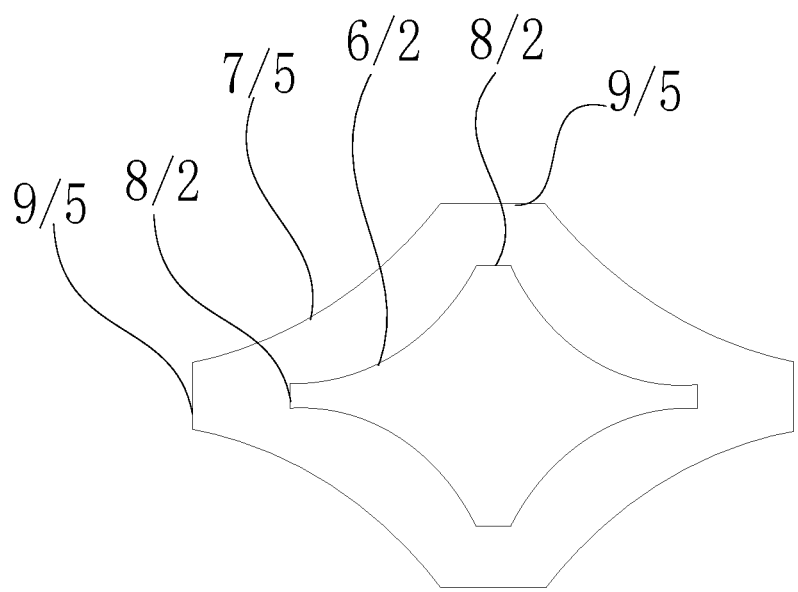
FIG. 4 is another enlarged schematic view showing a mask opening and the pixel opening in the region A in FIG. 2.
Figure 7:
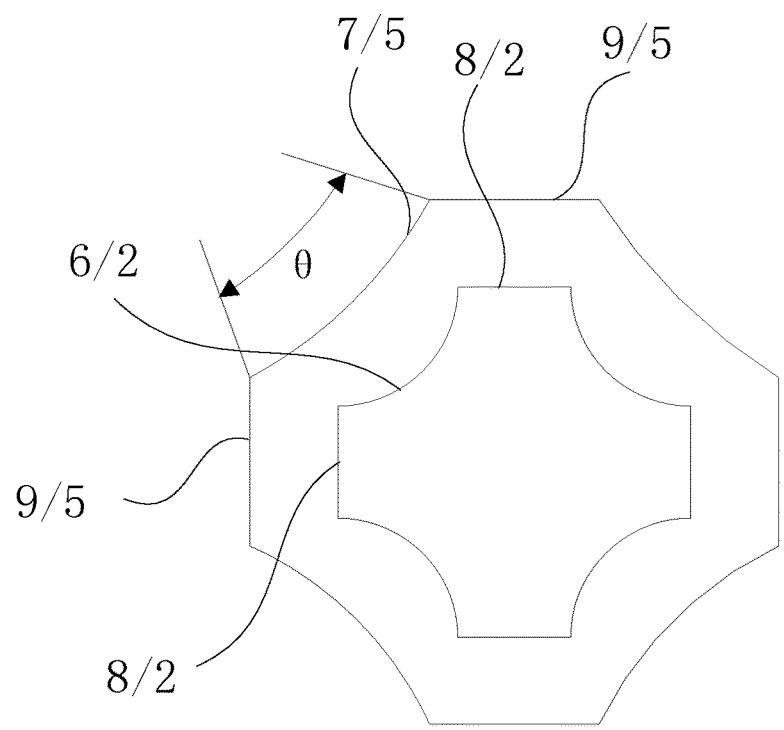
FIG. 7 is an enlarged schematic view showing a mask opening and a pixel opening in a region B in FIG. 6.

As shown in FIG. 4 or FIG. 7, an embodiment of the present disclosure further provides a mask sheet 1, different from the above embodiments, the mask edge 7, to which the curved edge 6 of the pixel opening 2 corresponds, is a curved line. Shapes of the mask edge 7 of the mask sheet 1 include a line with an inner concave surface or a line with an outer convex surface. The greater curvature the mask edge 7 has, the more difficulties the manufacturing process of the mask edge 7 has, which is not beneficial to realize mass production of the mask sheet 1. Therefore, in the present embodiment, a curvature of the curved mask sheet 7 is less than a curvature of the curved edge 6, which may simplify a manufacturing process that forming the mask sheet 1 having the sub-pixel 3 with the curved edge 6 that is mentioned above.

In one embodiment, as shown in FIG. 7, the mask edge 7 is an arc, and a central angle θ of the arc is greater than 0° and less than or equal to 30°. In the present embodiment, the arc having the central angle θ ranging from 0° to 30° is similar to a straight line, and the mask edge 7 having such the arc has an easier manufacturing process, which is beneficial to realize mass production of the mask sheet 1 which has the sub-pixel 3 with the curved edge 6 that is mentioned above.

As shown in FIG. 1 to FIG. 8, the present embodiment further provides a mask sheet 1, different from the above embodiments, a shape of the pixel opening 2 is an axisymmetric octagon, the pixel opening 2 includes four curved edges 6, and adjacent two curved edges 6 are connected to each other by a first straight edge 8 and correspond to the other adjacent two curved edges 6. A shape of the mask opening 5 is an axisymmetric octagon, the mask opening 5 includes four mask edges 7 which are in one-to-one correspondence with four curved edges 6, and adjacent two mask edges 7 are connected to each other by a second straight edge 9.

Specifically, an axis symmetry of the octagonal mask opening 5 is in a horizontal direction, in a vertical direction, or both in horizontal and vertical direction. Of course, the axis symmetry of the octagonal mask opening 5 may be in other directions. Specific location of the axis symmetry is not limited to the present embodiment.

Specifically, as shown in FIG. 6 to FIG. 8, lengths and curvatures of four curved edges 6 are same, and lengths and curvatures of four mask edges 7 are same. Of course, the four curved edges 6 may have two sets of identical lengths and curvatures (adjacent two curved edges 6 or opposite two curved edges 6 have the same lengths and curvatures). Four mask edges 7 may have two sets of identical lengths and curvatures (adjacent two mask edges 7 or opposite two mask edges 7 have the same lengths and curvatures). Lengths and curvatures of the curved edges 6 and mask edges 7 are not limited here.

Specifically, the first straight edge 8 is parallel to the second straight edge 9 corresponding thereto; furthermore, a length of the first straight edge 8 is less than a length of the second straight edge 9 corresponding thereto. In addition, lengths of the first straight edges 8 connecting with different curved edges 6 may be different, and lengths of the second straight edges 9 connecting with different mask edges 7 may be different as well. Lengths of the first straight edges 8 and the second straight edges 9 are not limited here. As shown in FIG. 4, when the first straight edges 8 of the pixel opening 2 are shorter than the curved edges 6 connecting therewith, and the first straight edge 8 and two curved edges 6 connecting therewith form a sharp corner, correspondingly, the second straight edges 9 of the mask opening 5 are shorter than two mask edges 7 connecting therewith, and the second straight edges 9 and two mask edges 7 connecting therewith form a sharp corner as well. When the sub-pixel 3 is manufactured by the mask sheet 1, evaporation effect on the sharp corner is not ideal due to a too-small area, which easily causes loss of sub-pixels on the sharp corner, thereby affecting display effect. To prevent the above problem, distances from the second straight edges 9 to the first straight edges 8 may be greater than distances from the mask edges 7 to the curved edges 6.

In the present embodiment, the mask sheet 1 may be used to manufacture the sub-pixel 3 which has four curved edges 6 with four inner concave surfaces each. Of course, a number of the curved edges 6 may also be one, two, or three, which is not limited here. The above mask sheet 1 may be used to manufacture sub-pixels with irregular shapes and realize mass production of such sub-pixels.

Figure 5:
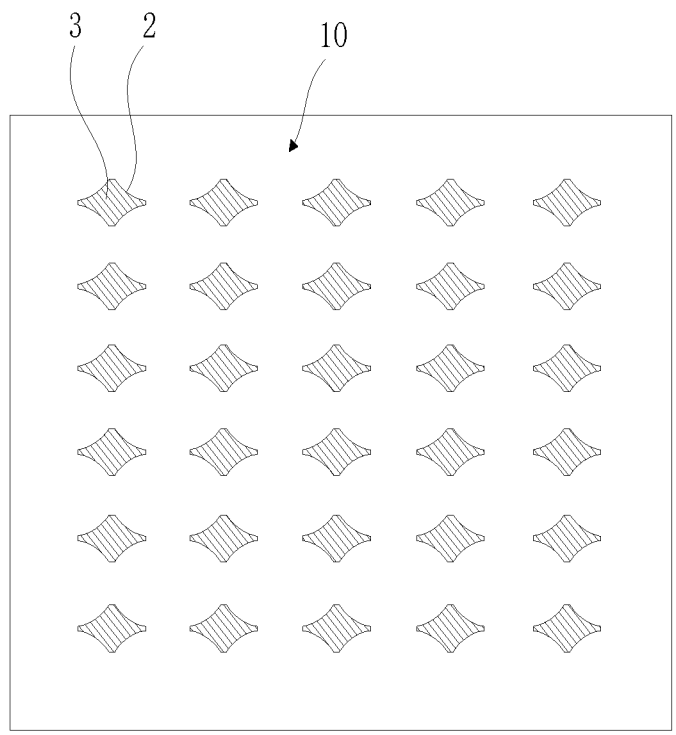
FIG. 5 is a schematic structural view showing a pixel structure provided by an embodiment of the present disclosure.

As shown in FIG. 1 and FIG. 5, the present embodiment further provides a pixel structure 10 including the sub-pixel 3 formed in the pixel opening 2, and the sub-pixel 3 is manufactured by the above mask sheet 1. Specifically, a number of the sub-pixel 3 is provided in plural, the sub-pixels 3 are arranged in an array, and shapes and sizes of the sub-pixels 3 are the same. In the present embodiment, the above mask sheet 1 may be used to manufacture the sub-pixel 3 which has the curved edge 6 having an inner concave surface, thereby diversifying shapes of the sub-pixels 3 and further diversifying pixel structures. It should be noted that distances between sub-pixels and arrangements of the sub-pixels as shown in FIG. 5 are specifically decided by the pixel openings corresponding thereto, and other types of arrangements also belong to the scope of embodiments of the present disclosure.

Figure 9:
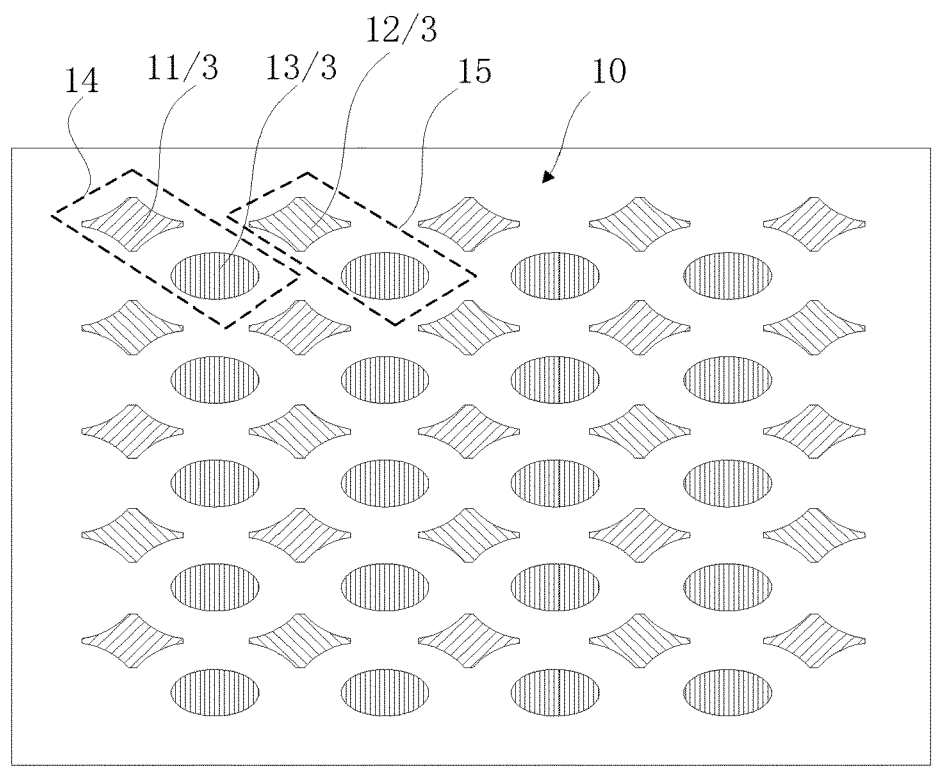
FIG. 9 is a schematic structural view showing another pixel structure provided by an embodiment of the present disclosure.

As shown in FIG. 9, the present embodiment further provides a pixel structure 10, different from the above embodiments, in the present embodiment, the sub-pixel 3 includes a first sub-pixel 11, a second sub-pixel 12, and a third sub-pixel 13. The first sub-pixel 11 and the third sub-pixel 13 form a first repeating unit 14. The second sub-pixel 12 and the third sub-pixel 13 form a second repeating unit 15. The first repeating unit 14 is provided in plural, the second repeating unit 15 is provided in plural, and the first repeating units 14 and the second repeating units 15 are disposed alternately both in row (horizontal) and column (vertical) directions. The third sub-pixels 13 are distributed evenly in an array, and every four third sub-pixels 13 surrounds one first sub-pixel 11 or one second sub-pixel 12. A shape of the first sub-pixel 11 is an axisymmetric octagon, the first sub-pixel 11 includes four curved edges with an inner concave surface each, and the curved edges are disposed near the third sub-pixel 13. A shape of the second sub-pixel 12 is also an axisymmetric octagon, the second sub-pixel 12 also includes four curved edges with an inner concave surface each, and the curved edges are disposed near the third pixel 13. Edges of the first sub-pixel 11 near the second sub-pixel 12 are straight edges, edges of the second sub-pixel 12 near the first sub-pixel 11 are straight lines as well, and adjacent two straight lines are parallel to each other. A shape of the third sub-pixel 13 includes a circle, an elliptical, a regular polygon, or a regular polygon with a rounded chamfer (only the ellipse is shown as an example). The first sub-pixel 11 and the second sub-pixel 12 are manufactured by the above mask, while the third sub-pixel 13 is manufactured by other masks having a mask opening corresponding a shape of the third sub-pixel 13.

Figure 10:
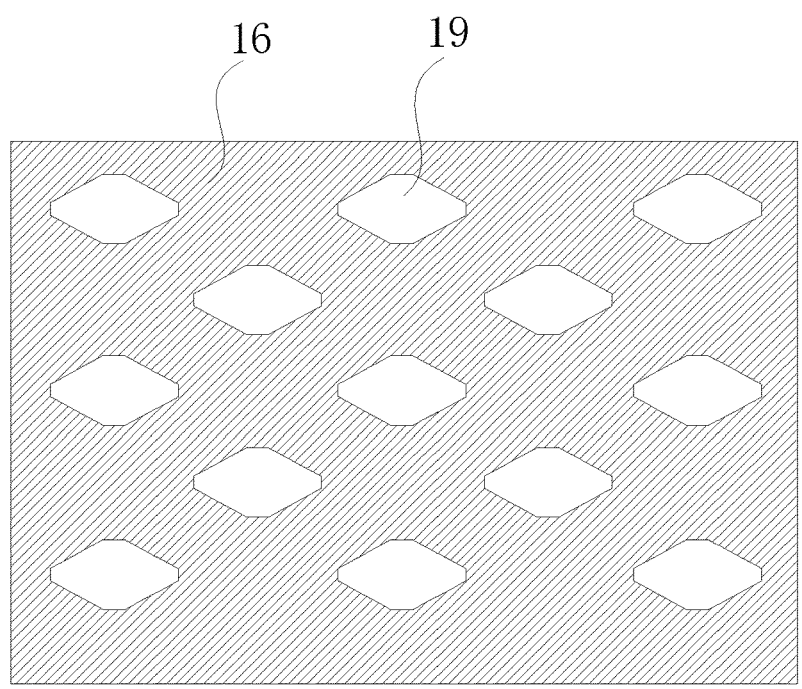
FIG. 10 is a schematic structural view showing another mask sheet provided by an embodiment of the present disclosure.
Figure 11:
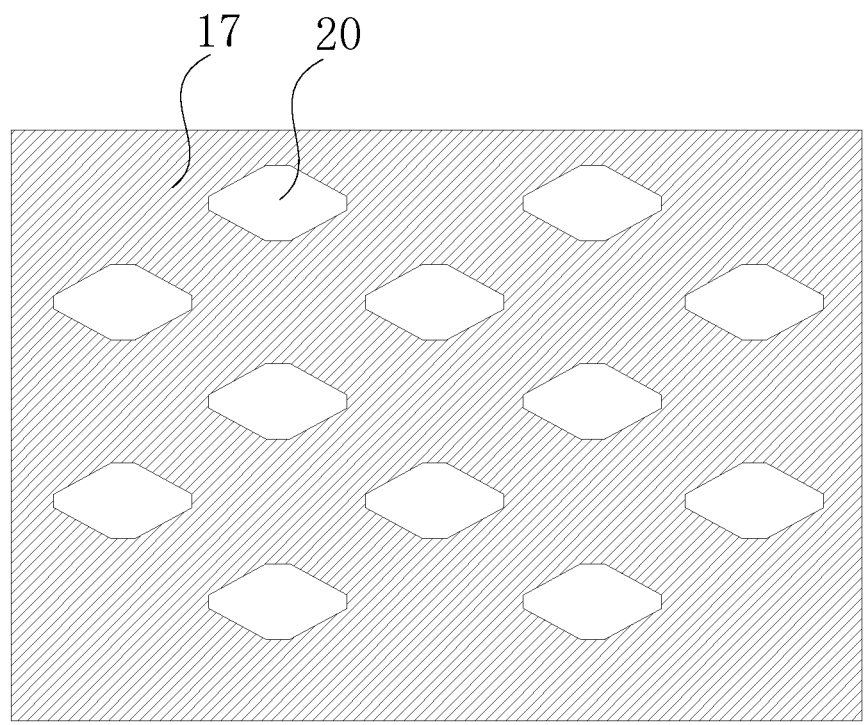
FIG. 11 is a schematic structural view showing yet another mask sheet provided by an embodiment of the present disclosure.
Figure 12:
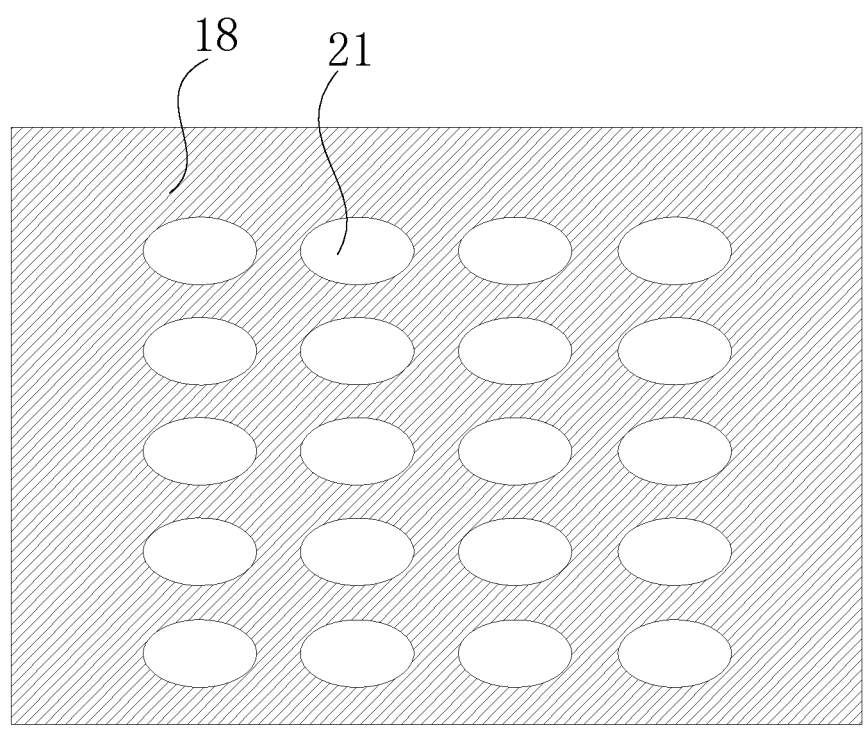
FIG. 12 is a schematic structural view exemplarily showing a mask sheet.

Specifically, as shown in FIG. 9 and FIG. 10, the first sub-pixel 11 is manufactured by a first mask sheet 16, and the first mask sheet 16 includes a first mask opening 19 configured to manufacture the first sub-pixel 11. As shown in FIG. 9 and FIG. 11, the second sub-pixel 12 is manufactured by a second mask sheet 17, and the second mask sheet 17 includes a second mask opening 20 configured to manufacture the second sub-pixel 12. As shown in FIG. 9 and FIG. 12, the third sub-pixel 13 is manufactured by a third mask sheet 18, and the third mask sheet 18 includes a third mask opening 21 configured to manufacture the third sub-pixel 13. The first mask sheet 16 and the second mask sheet 17 are mentioned in the above embodiments, and the third mask sheet 18 is another exemplary mask sheet.

Specifically, when the above pixel structure 10 is formed by the above three mask sheets, each mask sheet is combined with a cover mask, a howling mask, and an align mask to form a mask frame assembly (MFA), and the MFA is moved to a corresponding evaporation chamber to evaporate organic light-emitting materials corresponding to the sub-pixel 3. In a specific implementation, the sub-pixel 3 may be formed only one at a time, another sub-pixel 3 will not be formed until the former one is formed. Three types of sub-pixels 3 are sequentially formed to obtain the above pixel structure 10.

In the present embodiment, the third sub-pixel 13 is surrounded by inner surfaces of the first sub-pixel 11 and the second sub-pixel 12, three sub-pixels 3 are arranged tightly so that an aperture ratio of the display panel may be increased. Furthermore, the first sub-pixel 11, the second sub-pixel 12, and the third sub-pixel 13, which are adjacent to each other, form a light-emitting pixel. The pixels realize high resolution display effect from low physical resolution by the principle of color mixture. The above pixel structure 10 is formed by the cooperation of the mask sheet 1 of the above embodiments and other mask sheets, thereby realizing mass production of a display panel having the pixel structure 10 which has a high aperture ratio, high resolution, an irregular shape.

In one embodiment, the first sub-pixel 11, the second sub-pixel 12, and the third sub-pixel 13 include any one of a red sub-pixel, a green sub-pixel, and a blue sub-pixel, and colors of the first sub-pixel 11, the second sub-pixel 12, and the third sub-pixel 13 are different. In the present embodiment, the green sub-pixel may form a light-emitting pixel with a red sub-pixel and a blue sub-pixel which are adjacent to the green sub-pixel. The pixels realize high resolution display effect from low physical resolution by the principle of color mixture.

To sum up, the present disclosure has been described with preferred embodiments thereof. The preferred embodiments are not intended to limit the present disclosure, and it is understood that many changes and modifications to the described embodiment can be carried out without departing from the scope and the spirit of the disclosure that is intended to be limited only by the appended claims.

What is claimed is:

1. A mask sheet, comprising a mask opening configured to manufacture a sub-pixel in a pixel opening of a display panel, wherein an area of the mask opening is greater than an area of the pixel opening to which the mask opening corresponds, the pixel opening comprises at least one curved edge with an inner concave surface, and the mask opening comprises at least one mask edge; and the at least one mask edge is in one-to-one correspondence with the at least one curved edge, and a curvature of each of the at least one mask edge is less than a curvature of the at least one curved edge to which the each of the at least one mask edge corresponds.

2. The mask sheet of claim 1, wherein the at least one mask edge is a straight line.

3. The mask sheet of claim 1, wherein the at least one mask edge is a curved line.

4. The mask sheet of claim 3, wherein the at least one mask edge is an arc, and a central angle of the arc is greater than 0° and less than or equal to 30°.

5. The mask sheet of claim 1, wherein a shape of the mask opening is axisymmetric.

6. The mask sheet of claim 1, wherein a shape of the mask opening comprises a regular polygon or a regular polygon with a chamfer.

7. The mask sheet of claim 1, wherein a shape of the pixel opening is an axisymmetric octagon, the pixel opening comprises four curved edges, and adjacent two curved edges are connected to each other by a first straight edge and correspond to the other adjacent two curved edges; and a shape of the mask opening is an axisymmetric octagon, the mask opening comprises four mask edges which are in one-to-one correspondence with four curved edges, and adjacent two mask edges are connected to each other by a second straight edge.

8. The mask sheet of claim 7, wherein lengths and curvatures of the four curved edges are same, and lengths and curvatures of the four mask edges are same.

9. The mask sheet of claim 7, wherein the first straight edge is parallel to the second straight edge, and a length of the first straight edge is less than a length of the second straight edge.

10. The mask sheet of claim 7, wherein a distance between the second straight edge and the first straight edge to which the second straight edge corresponds is greater than a distance between one of the four mask edges and one of the four curved edges to which the one of the four mask edges corresponds.

11. The mask sheet of claim 1, wherein the mask sheet comprises a fine metal mask sheet.

12. A mask sheet, comprising a mask opening configured to manufacture a sub-pixel in a pixel opening of a display panel, wherein an area of the mask opening is greater than an area of the pixel opening to which the mask opening corresponds;
    a shape of the pixel opening is an axisymmetric octagon, the pixel opening comprises four curved edges having four inner concave surfaces each, and adjacent two curved edges are connected to each other by a first straight edge and correspond to the other adjacent two curved edges;
    a shape of the mask opening is an axisymmetric octagon, the mask opening comprises four mask edges which are in one-to-one correspondence with the four curved edges having the four inner concave surfaces each, and adjacent two mask edges are connected to each other by a second straight edge; and
    the first straight edge is parallel to the second straight edge, and a length of the first straight edge is less than a length of the second straight edge.

13. A pixel structure, comprising a sub-pixel formed in a pixel opening of a display panel, wherein the sub-pixel is made by a mask sheet;
    the mask sheet comprises a mask opening configured to manufacture the sub-pixel in the pixel opening of the display panel, an area of the mask opening is greater than an area of the pixel opening to which the mask opening corresponds, the pixel opening comprises at least one curved edge with an inner concave surface, and the mask opening comprises at least one mask edge; and
    the at least one mask edge is in one-to-one correspondence with the at least one curved edge, and a curvature of each of the at least one mask edge is less than a curvature of the at least one curved edge to which the each of the at least one mask edge corresponds.

14. The pixel structure of claim 13, wherein the at least one mask edge is a straight line.

15. The pixel structure of claim 13, wherein the at least one mask edge is a curved line.

16. The pixel structure of claim 15, wherein the at least one mask edge is an arc, and a central angle of the arc is greater than 0° and less than or equal to 30°.

17. The pixel structure of claim 13, wherein a shape of the mask opening is axisymmetric.

18. The pixel structure of claim 13, wherein a shape of the mask opening comprises a regular polygon or a regular polygon with a chamfer.

19. The pixel structure of claim 13, wherein a shape of the pixel opening is an axisymmetric octagon, the pixel opening comprises four curved edges, and adjacent two curved edges are connected to each other by a first straight edge and correspond to the other adjacent two curved edges; and
    a shape of the mask opening is an axisymmetric octagon, the mask opening comprises four mask edges which are in one-to-one correspondence with four curved edges, and adjacent two mask edges are connected to each other by a second straight edge.

20. The pixel structure of claim 19, wherein lengths and curvatures of the four curved edges are same, and lengths and curvatures of the four mask edges are same.

\* \* \* \* \*